United States Patent
Chao (10) Patent No.: US 11,193,957 B2
(45) Date of Patent: Dec. 7, 2021

(54) SHUNT RESISTOR AVERAGING TECHNIQUES

(71) Applicant: Analog Devices International Unlimited Company, Limerick (IE)

(72) Inventor: Hio Leong Chao, Tempe, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 180 days.

(21) Appl. No.: 16/539,404

(22) Filed: Aug. 13, 2019

(65) Prior Publication Data

US 2021/0048453 A1    Feb. 18, 2021

(51) Int. Cl.
*G01R 15/14* (2006.01)
*G01R 1/30* (2006.01)
(Continued)

(52) U.S. Cl.
CPC .......... *G01R 15/146* (2013.01); *G01R 1/30* (2013.01); *G01R 19/2506* (2013.01);
(Continued)

(58) Field of Classification Search
CPC ........ G01R 15/14; G01R 15/146; G01R 1/30; G01R 19/25; G01R 19/2506; H01L 23/528; H01L 23/522; H01L 23/5228; H03F 3/45071; H03F 2203/45536; H03F 2200/462; H03F 2200/129; H03F 2200/156; H03F 2203/4511
See application file for complete search history.

(56) References Cited

U.S. PATENT DOCUMENTS

| 4,937,697 A | 6/1990 | Edwards et al. |
| 5,347,419 A | 9/1994 | Caron et al. |

(Continued)

FOREIGN PATENT DOCUMENTS

| CN | 107528487 A | 12/2017 |
| CN | 112986666 A | 6/2021 |

(Continued)

OTHER PUBLICATIONS

"LT6118: Current Sense Amplifier, Reference and Comparator with POR", Linear Technology Corp., (2014), 24 pgs.
(Continued)

*Primary Examiner* — Son T Le
(74) *Attorney, Agent, or Firm* — Schwegman Lundberg & Woessner, P.A.

(57) ABSTRACT

Techniques for improving current sensing via a shunt resistance are provided. In an example, an apparatus for sensing current can include a substrate, and a plurality of metal layers stacked on the substrate and separated from the substrate and from each other by an insulation material. In certain examples, a first one or more metal layers can form a sense resistance configured to pass current between a source and a load, and a second one or more metal layers can form one or more gain resistances coupled to the sense resistance and configured to couple to a current sense amplifier. In some example, a metal layer can include portions of both the sense resistance and the gain resistance to compensate for environmental anomalies, material anomalies or manufacturing anomalies.

20 Claims, 8 Drawing Sheets

(51) Int. Cl.
*H01L 23/528* (2006.01)
*H01L 23/522* (2006.01)
*H03F 3/45* (2006.01)
*G01R 19/25* (2006.01)

(52) U.S. Cl.
CPC ........ *H01L 23/528* (2013.01); *H01L 23/5228* (2013.01); *H03F 3/45071* (2013.01); *H03F 2200/129* (2013.01); *H03F 2200/156* (2013.01); *H03F 2200/462* (2013.01); *H03F 2203/45116* (2013.01); *H03F 2203/45536* (2013.01)

(56) References Cited

U.S. PATENT DOCUMENTS

| | | | |
|---|---|---|---|
| 5,498,984 | A | 3/1996 | Schaffer |
| 5,920,189 | A | 7/1999 | Fisher et al. |
| 6,977,489 | B2 | 12/2005 | Isham |
| 7,031,855 | B2 | 4/2006 | Mottola |
| 7,215,999 | B1 | 5/2007 | Shahandeh et al. |
| 7,683,604 | B1 * | 3/2010 | Steele ............... G01R 1/30 324/123 R |
| 7,936,540 | B2 | 5/2011 | Isham |
| 8,324,721 | B2 | 12/2012 | Udompanyavit et al. |
| 8,436,681 | B2 | 5/2013 | Ho et al. |
| 9,304,152 | B2 | 4/2016 | Aerts |
| 9,407,145 | B1 | 8/2016 | Burstein et al. |
| 9,671,437 | B2 | 6/2017 | Akahane |
| 9,673,192 | B1 | 6/2017 | Lopata et al. |
| 9,709,603 | B2 | 7/2017 | Ferguson |
| 10,312,800 | B2 | 6/2019 | Yamada |
| 2010/0079132 | A1 | 4/2010 | Steele et al. |
| 2011/0089931 | A1 * | 4/2011 | Podlisk ............... G01R 1/203 324/126 |
| 2011/0095818 | A1 * | 4/2011 | Sullivan ............... G01R 1/20 330/124 R |
| 2015/0260760 | A1 | 9/2015 | Katakura et al. |
| 2016/0173045 | A1 * | 6/2016 | Creosteanu ......... H03F 3/45748 330/258 |
| 2017/0089955 | A1 * | 3/2017 | Yugou ............... G01R 31/396 |
| 2017/0253029 | A1 * | 9/2017 | Inoue ................ B41J 19/202 |
| 2019/0050009 | A1 | 2/2019 | Price et al. |
| 2019/0257865 | A1 | 8/2019 | Mcphalen |
| 2021/0181238 | A1 | 6/2021 | Chao et al. |

FOREIGN PATENT DOCUMENTS

| | | |
|---|---|---|
| DE | 102020132400 A1 | 6/2021 |
| EP | 0397102 A2 | 11/1990 |
| EP | 2388599 A2 | 11/2011 |
| JP | 4888714 B2 | 12/2011 |
| JP | 5096020 B2 | 9/2012 |

OTHER PUBLICATIONS

"Sensing Elements for Current Measurements", Renesas Electronics America Inc (REA), (2018), 17 pgs.

"Simplifying Current Sensing: How to design with current sense aplifiers", Texas Instruments Inc., (2018), 53 pgs.

Huang, Wenkang, et al., "Inductors Allow Loss-Less Current Sensing in Multiphase DC-DC Converters", PCIM, 27(6), (Jun. 2001), 58-67.

Johnson, Matthew Robert, "Fast, Accurate Power Measurement and Optimization for Microprocessor Platforms", Ph.D. Dissertation in Electrical and Computer Engineering, University of Illinois at Urbana-Champaign, (2015), 81 pgs.

Munoz, Diego Ramirez, et al., "Constant Current Drive for Resistive Sensors Based on Generalized Impedance Converter", IEEE Transactions on Instrumentation and Measurement, 57(10), (Oct. 2008), 2290-2296.

Yiu, Chun-Chee Francis, "Gain-Reconfigurable Current-Sensing Circuit for High-Frequency Low-Power dc-dc Converters", Masters Thesis in Electrical and Computer Engineering at the University of Toronto, (2010), 95 pgs.

"U.S. Appl. No. 16/717,699, Non Final Office Action dated Mar. 8, 2021", 11 pgs.

"U.S. Appl. No. 16/717,699, Notice of Allowance dated Jul. 15, 2021", 5 pgs.

"U.S. Appl. No. 16/717,699, Response filed Jun. 8, 2021 to Non Final Office Action dated Mar. 8, 2021", 10 pgs.

* cited by examiner

SHUNT RESISTOR AVERAGING TECHNIQUES

TECHNICAL FIELD OF THE DISCLOSURE

The present disclosure is related to current sensing circuits and more particularly to techniques for averaging environmental conditions of a multiple layer shunt resistor module.

BACKGROUND

Electrical current sensing is a function performed in many electronic devices. Current sensors come in many sizes and shapes and based on variety of motivations. One way to measure current is by inserting a known resistor in series with the current path, measuring the voltage develops across the resistor, and determining the current level using ohms law. The known resistor is commonly referred to as a current sense resistor (Rsns). It is typically implemented using a discrete resistor on a printed circuit board (PCB). Improvements of using a lone current sense resistor can also use a replica resistor (Rg) to extract the current information out of a sense resistor. A replica resistor can be a scaled version of the current sense resistor that is used to generate a replica current that is proportional to the sense current.

A discrete low temperature coefficient (TC) precision current sense resistor is expensive in terms of component cost and PCB footprint and thus it is advantageous to have the current sense resistor on chip. Bondwire and lead frame have been previously used as current sense resistor for current sensing. These methods work well for applications where moderate current monitoring accuracy are required. For those implementations, the replica resistor is typically implemented by interconnect in the silicon in order to achieve the large Rg/Rsns ratio required. The interconnect is usually referred to as metal in silicon process. And because the replica and sense resistor are made up of different material, each resistor will have a different TC. Whether it is bondwire or lead frame sensing, the sense resistor and replica resistor can be hundreds of microns apart and depending on the power dissipation of the sense resistor, the replica and sense resistor could operate at a very different temperature. These factors cause the sense and replica resistor ratio to vary over operating corners and limits the accuracy a current sensing design can achieve.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized techniques for improved current sensing. In certain examples, the techniques can employ sense and gain transistors fabricated on a substrate using multiple metal layers separated by an insulative material. In certain examples, the configuration of the resistors in the metal layers can ensure that the gain resistors track environmental conditions of the sense resistors. In some examples, the configuration of the resistors in the metal layers can ensure that characteristics of each metal layer are averaged in the final formation of each resistor and match the averaged characteristics of the other resistors of the configuration. In some examples, the configuration of the resistors within the device can average characteristics of the device that can vary across the physical extents of the device.

Figure 1A:
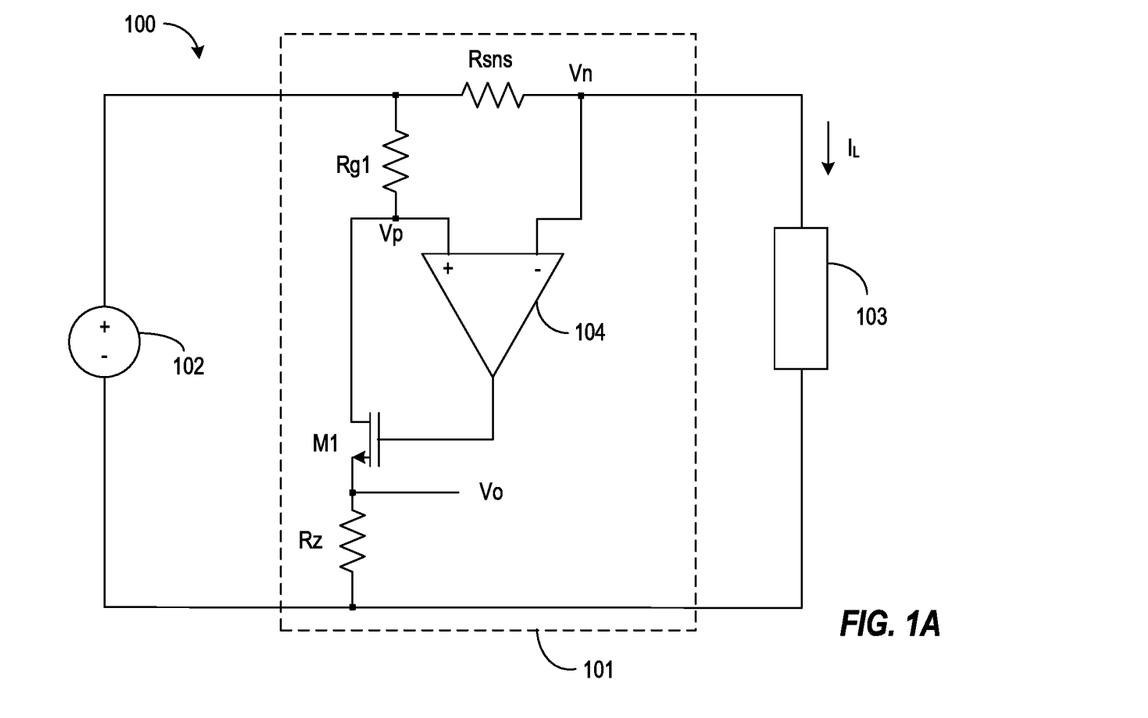
FIG. 1A illustrates generally an example system including an example current sensing circuit according to various examples of the present subject matter.

FIG. 1A illustrates generally an example system 100 including an example current sensing circuit 101 according to various examples of the present subject matter. The system 100 can include the current sensing circuit 101, a supply 102, and a load 103. The current sensing circuit 101 can include a sense resistance (Rsns), a gain resistance (Rg), an amplifier 104, and an output transistor (M1). As used herein, the term "resistance" can include one or more resistors. The sense resistance (Rsns) can be placed in series between the load 103 and the supply source 102 such that the voltage (vp-vn) across the sense resistance (Rsns) is indicative of load current ($I_L$). The gain resistance (Rg) can be a scaled version of the sense resistance (Rsns) and typically is much larger in terms of resistance compared to the sense resistance (Rsns). As an example, the sense resistance (Rsns) can be in the microohms range of resistance and the gain resistance (Rg) can be in the hundreds or thousands of ohms range. The gain resistance (Rg) can be connected to a first terminal of the sense resistance (Rsns). The second terminal of the gain resistance (Rg) can be connected to the non-inverting input of the amplifier 104. The inverting input of the amplifier 104 can be connected to the second terminal (e.g., vn) of the sense resistance (Rsns). The gate of the output transistor (M1) can be driven by the output of the amplifier 104 and can provide a path for current to flow from the gain resistance (Rg) to an optional output resistance (Rz). Due to negative feedback, the amplifier 104 can drive the gate of the output transistor (M1) until the differential input voltage between the inputs of the amplifier 104 is 0V. If the first voltage (Vp) of the first terminal of the amplifier 104 is higher than the second voltage (Vn) of the second input of the amplifier 104, the amplifier 104 can drive the output transistor (M1) to cause the first voltage (Vp) to decrease until the first voltage (Vp) and the second voltage (Vn) are equal. When the differential input voltage (Vp-Vn) of the amplifier is 0V, the current sensing circuit 101 is in equilibrium. At equilibrium, the voltage across the sense resistance (Rsns) equals the voltage across the gain resistance (Rg). The current of the gain resistance (Rg), the replica current, is generally proportional to the load current ($I_L$) by the resistance ratio Rsns/Rg. Assuming the amplifier 104 has high input impedance and zero input current, the replica current can be converted to a voltage by the optional output resistance (Rz) to provide a voltage indicative of the load current ($I_L$). In such examples, the output voltage (Vo) of the current sense circuit 101 can be given by;

$$Vo=Rz*I_L*Rsns/Rg. \quad (1)$$

Thus, the output voltage (Vo) of the current sensing circuit 101 is proportional to the ratio Rsns/Rg and Rz.

Figure 1B:
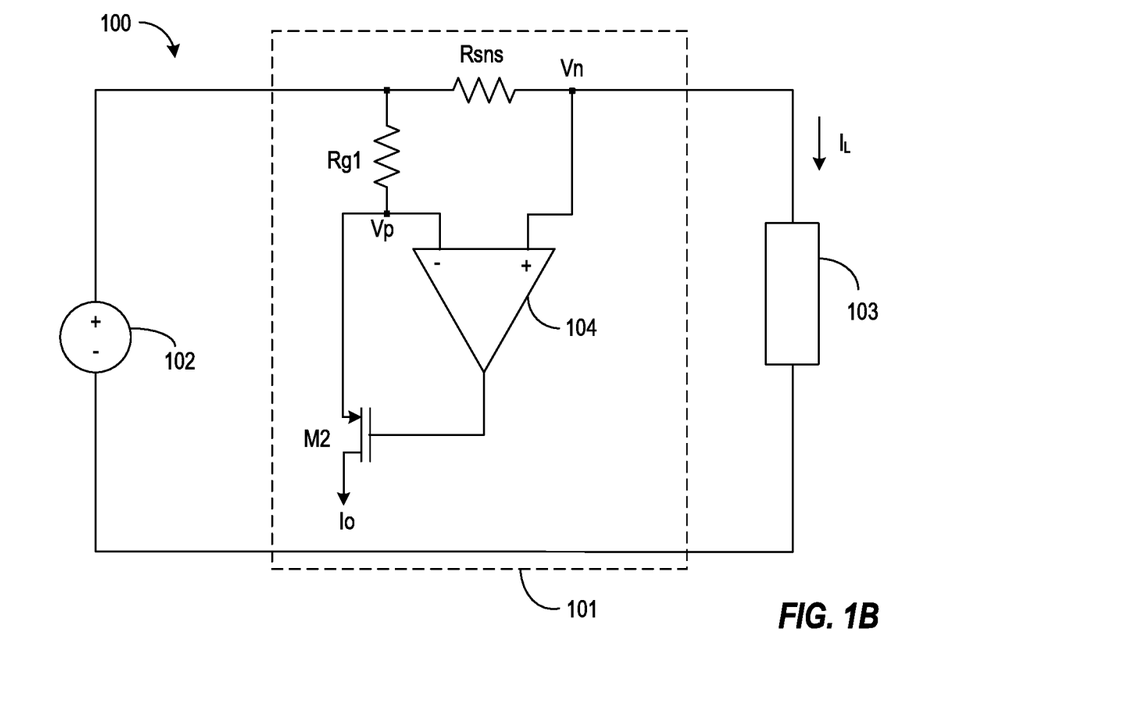
FIG. 1B shows a current sense circuit with a current output.

Some current sense circuit designs have current outputs (Io) instead of voltage outputs (Vo). For those designs, it is not necessary to have the optional output resistance (Rz) and the N-type metal-oxide-semiconductor (NMOS) transistor M1 can be replaced by a P-type metal-oxide-semiconductor (PMOS) transistor (M2) to increase the output impedance. FIG. 1B shows a current sense circuit 105 with such arrangement. The inverting and non-inverting input terminals of the amplifier 104 are swapped with the non-inverting input connected to the load 103 and the inverting terminal connected to the gain resistance (Rg). The output of the amplifier 104 can drive the gate of the PMOS transistor (M2) and the drain current of the output transistor (M2) can be taken as the output signal. The output signal can include a replica current (Io) that is proportional to the load current (IL).

Figure 2:
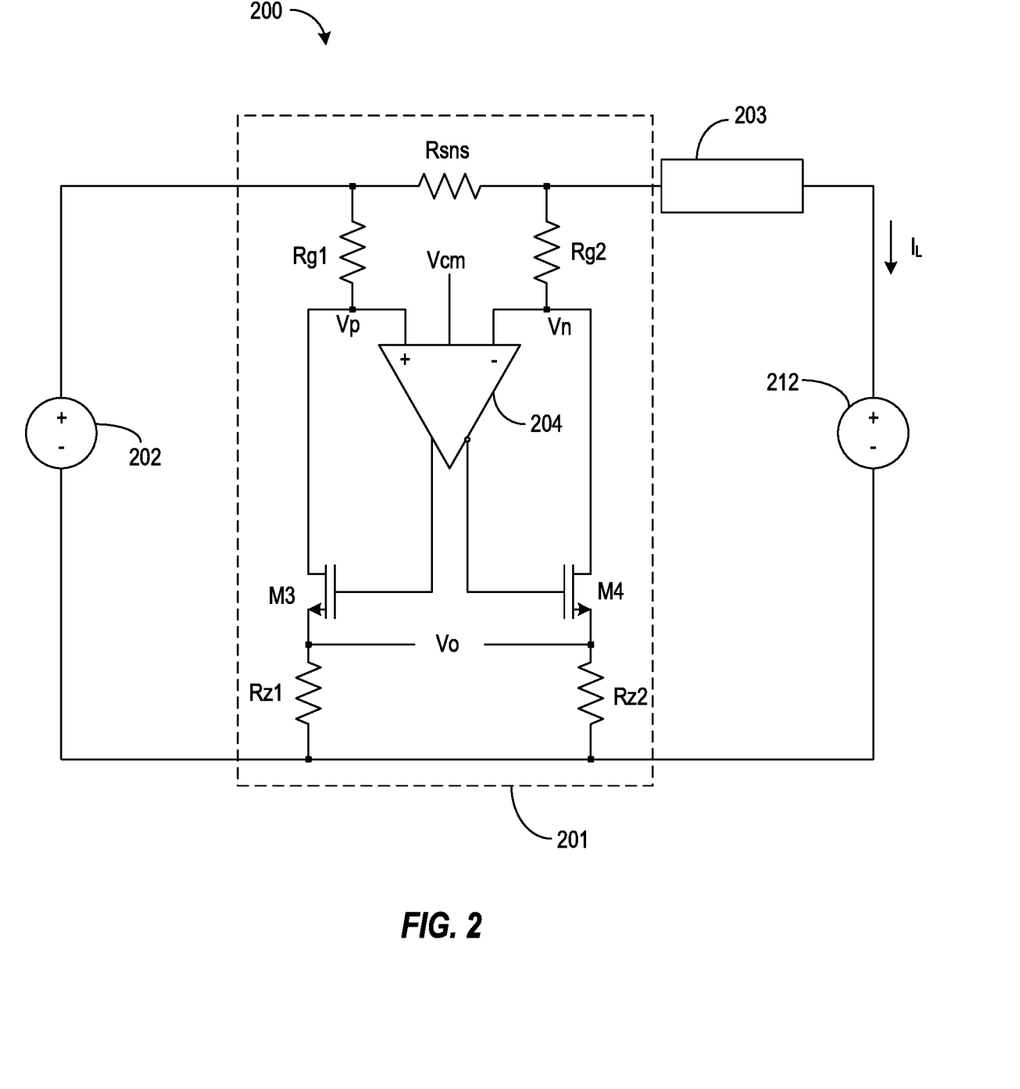
FIG. 2 illustrates generally an example system including an example current sensing circuit for sensing bidirectional current flow according to various examples of the present subject matter

The circuits of FIGS. 1A and 1B can be used for unipolar current sensing. FIG. 2 illustrates generally an example system 200 including an example current sensing circuit for sensing bidirectional current flow according to various examples of the present subject matter. The current sensor circuit 201 can include a sense resistance (Rsns), gain resistances (Rg1, Rg2), an amplifier 204, and output transistors (M3, M4). The sense resistance (Rsns) can be placed in series with the load 203 and one or more supply sources 202, 212 such that the bipolar voltage (vp-vn) across the sense resistance (Rsns) is indicative of level and direction of the load current ($I_L$). The gain resistances (Rg1, Rg2) can be a scaled version of the sense resistance (Rsns) and typically are much larger in terms of resistance compared to the sense resistance (Rsns). As an example, the sense resistance (Rsns) can be in the microohms range of resistance and the gain resistance (Rg) can be in the hundreds or thousands of ohms range. The gain resistances (Rg1, Rg2) can be connected to a corresponding terminals of the sense resistance (Rsns). The second terminals of the gain resistances (Rg1, Rg2) can be connected to the inputs of the amplifier 204. The amplifier can provide complimentary outputs and the outputs can be coupled to the control nodes, or gates, of the output transistors (M3, M4). The output transistors (M3, M4) can provide a path for current to flow from the corresponding gain resistance (Rg1, Rg2) to optional output resistances (Rz1, Rz2). At equilibrium, the differential input of the amplifier 204 can be driven to zero by negative feedback. When the load current flows via the sense resistance (Rsns) in a first direction, the differential output voltage (Vo) can be greater than 0V. When the load current flows via the sense resistance (Rsns) in a second, opposite direction, the differential output voltage (Vo) can be less than 0V. Assuming the gain resistances (Rg1, Rg2) are matched and the output resistances (Rz1, Rz2) are matched, the output voltage (Vo) is given by:

$$Vo=Rz1*Isns*Rsns/Rg1. \quad (2)$$

Unlike the conventional methods of current sensing through bond wire or lead frame, the present subject matter provides sense and gain resistances realized by metal layers of formed atop a substrate such as by, but not limited to, metal layers formed and stacked atop a semiconductor substrate via semiconductor integrated circuit processes as discussed below. Again, at equilibrium, the output voltage (Vo) can have a value indicative of the load current level and a polarity indicative of a direction of the load current. In certain examples, the amplifier 204 can include a common mode input (Vcm) for adjusting or setting an offset of the current sensor circuit 201. Although not limited as such, thermoelectric devices and motors can be typical loads 203 for the illustrated system.

For accurate and precise current sensing, there should be little if any variation of the resistance ratio Rsns/Rg. The same holds true for the optional output resistance of FIG. 1A or FIG. 2. However, conventional and financially practical resistance devices generally have characteristics that can vary widely due to environmental conditions such as temperature, materials, and/or fabrication anomalies. Typically, if not specifically compensated for, temperature variation can be an over-riding influence to generate current sensing error. For example, with the current sense resistance (Rsns) in series with the load, the power dissipation of the current sense resistance (Rsns) can be quite high compared to the gain resistance (Rg). As an example, when the load current ($I_L$) is at maximum, the sense resistance (Rsns) can be operating at a much higher temperature than the replica or gain resistance (Rg). The high temperature of the sense resistance (Rsns) can significantly change the resistance compared to when the sense resistance (Rsns) is not at a high temperature. The change in sense resistance can change the resistance ratio (Rsns/Rg) which can lead to inaccurate load current sensing. Solutions to such issues can include using expensive resistance devices for the sense and gain resistances that have a temperature constant of near zero or better over the desired operating range or limiting the operating range of the sensing circuit.

Figure 3A:
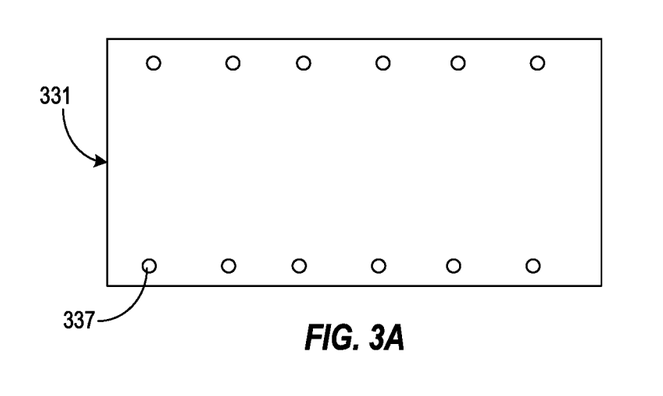
FIGS. 3A-3C illustrate an example resistance module for current sensing according to the present subject matter.
Figure 3B:
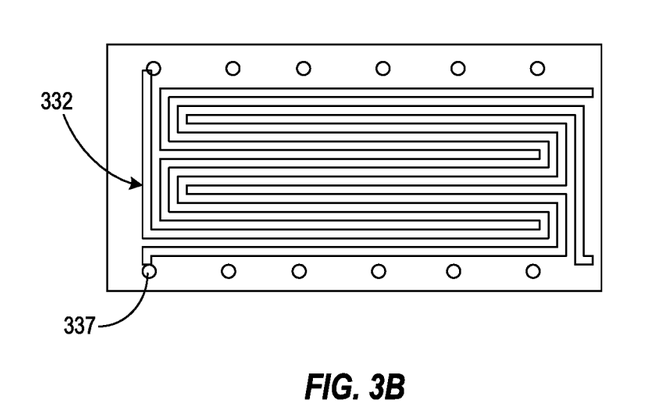
Figure 3C:
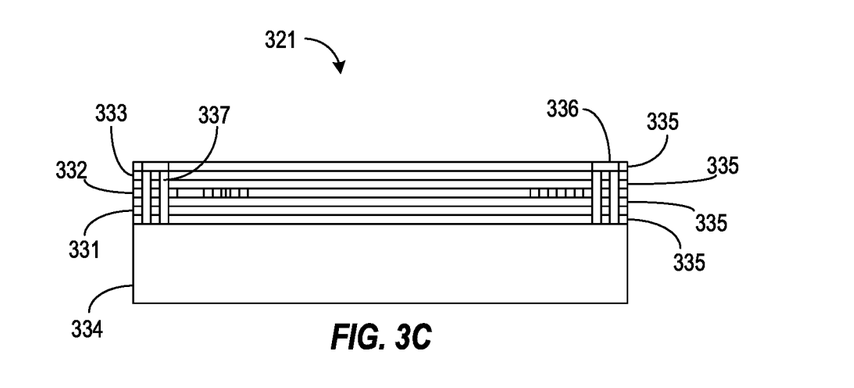

The present inventors have recognized techniques to ensure the resistance ratio between the sense resistance and the gain resistance can be maintained over a wide operating range of the example current sensing circuits without using expensive resistances having very low temperature constants over a wide range of operating temperatures. FIGS. 3A-3C illustrate an example resistance module 321 for current sensing according to the present subject matter. FIG. 3A illustrates generally a top view of a first metal layer 331 or a third metal layer 333 of the example module 321. FIG. 3B illustrates generally top view of a second metal layer 332 of the example module 321. FIG. 3C illustrates a side cutaway view of the example module 321. The example module 321 can include a substrate 334, several metal layers 331, 332, 333 separated from each other and from the substrate 334 by an insulating material 335, terminals 336, and several conductive vias 337 for coupling layers together and for coupling layers to the terminals 336. In the illustrated example of FIGS. 3A-3C, the second metal layer 332 can be fabricated to form one or more gain resistances (e.g., Rg) and the first and third metal layers form one or more sense resistances (Rsns).

The metal layers 331, 333 forming the sense resistance (Rsns) bodies can generally be continuous layers of metal coextensive with the limits of the module 321 or coextensive with the real estate of the module 321 set aside for the sense (Rsns) and gain resistances (Rg). The second metal layer 332 can be positioned between the first metal layer 331 and the third metal layer 333 and can be etched or otherwise patterned to form a serpentine pattern. The serpentine pattern can allow the same metal material to be used to form both the sense and gain resistances (Rsns, Rg) while also allowing the resistance of the gain resistance (Rg) to be much larger than the resistance of the sense resistance (Rsns). Vias 337 can couple the first and third metal layers 331, 333 to each other, the first and third metal layers 331, 333 to the terminals 336, one end of each serpentine pattern of the second metal layer 332 to one of the ends of one of the sense resistances (Rsns) of the first or third metal layers 331, 333, or combinations thereof. The particular structure of the module 321 of FIGS. 3A-3C can allow the one or more gain resistances (Rg) to experience the same temperature of the one or more sense resistances (Rsns) and, thus, maintain a nearly constant resistance ratio over a range of operating temperatures of the sense resistances (Rsns).

In some examples, the substrate 334 can include, but is not limited to, a semiconductor substrate, or a printed circuit board substrate or a resin-based substrate including a Bis-maleimide-Triazine (BT) substrate. The insulating material 335 can be an oxide in certain examples. The metal layers 331, 332, 333 and the insulating material layers can be quite thin. In certain examples, a thickness of the metal layers 331, 332, 333 or a thickness of the insulating layers 335 can be on the order of a few micrometers or lower. In certain examples, the stack of via 337 and metal layers 331, 332, 333 can act as thermal barrier that blocks heat flowing into the sense resistance and provides a low thermal resistance path for the heat to escape the substrate. The thickness of each metal layer and the separation between each metal layers are typically less than a micrometer. In some examples, a semiconductor substrate can underly the first metal layer and can have a typical thickness between 200 um to 400 um. The distance between first metal layer and the semiconductor substrate can be less than a micrometer.

TABLE 1

| Material | Thermal Conductivity [W/(m K)] |
|---|---|
| Wafer Substrate | 149 |
| Copper | 386 |
| Aluminum | 204 |
| Oxide | 1.4 |

The thermal conductivity of some example materials are shown in Table 1 and is expressed in unit W/(m K.) or Watt per meter Kelvin. The higher the thermal conductivity, the better the material is for thermal conduction. Thermal resistance is defined as $$Rth = Lth/(k*Ath), \quad (3)$$

where Lth is the distance of heat flow and Ath is the cross-section area of heat flow. Just like electrical resistance, a smaller cross-section area or larger distance results in a higher thermal resistance. In silicon process, aluminum is typically used for metal layers and oxide is the insulator between metal layers and substrate. Although metal has a relatively high thermal conductivity, it is not an effective medium for lateral heat transfer. This is due to the fact that metal layers are thin, and hence a small the cross-section area with respect the distance of heat flow. In comparison, the silicon substrate is a much better medium for lateral heat flow. It has relatively good thermal conductivity and large cross-section area of heat flow due to its thickness.

In examples with a silicon substrate, the substrate 334 can be a good thermal conductive material, can absorb heat generated from the current sense resistance and can transfer the heat laterally to the terminals 336 and through the stack of metal layers and vias. With the substrate absorbing and transferring heat, the amount of bending in term of temperature in the metals can be reduced. For metal near the terminals 336, a significant amount of heat in the third metal layer 333 can flow laterally to the terminals 336 or in the case of first metal layer 331, heat can flow laterally to the via 337 and metal stack and then to the terminals 336. Heat generated in the middle of the resistance bodies can experience much larger thermal resistance laterally along the metal to the terminals 336. For heat generated in the middle of the resistance bodies, a significant portion of such heat can flow vertically to the substrate 334. In certain examples, thermal resistance from the sense resistance body to the substrate 334 is much lower than the lateral thermal resistance due to the small distance between the metal and the substrate 334 and large cross-section of heat flow. Even though oxide is a poor thermal conductor compared to the metal, the thinness of the oxide and the large cross-section of heat flow can provide a relatively low thermal resistance path between the sense resistance of the first metal layer 331 and the silicon substrate 334. For the same reason, the thermal resistance between each of metal layers is relatively small and thus the temperatures in each metal layer can match well. With the replica or gain resistances (Rg) being in the second metal layer 332 located between the metal layers 331, 333 associated with the bodies of the sense resistance (Rsns), the temperature of the gain resistance (Rg) can closely track the temperature of the sense resistance (Rsns). In certain examples, the above described techniques can allow the temperature of the sense and gain resistances (Rsns, Rg) to match much better than designs that use bondwire or lead frame as a sense resistance.

In certain examples, due to process corners, the absolute values of the sense and replica resistance can vary from part to part. And because the sense and replica are realized in different metal layers, the sense and replica resistance could vary independently. Such layer variation can result in a part to part variation for the resistance ratio. In certain examples, part-to-part variation can be corrected by adjusting or trimming the output resistance (Rz) to give the desired current sense output.

In certain examples, the terminals 336, or terminations, or pads, are not limited to be placed only on the side of the sense resistance body. It is also not necessary for the terminals 336 to be in the same layer as the top metal layer of the sense resistance body. Suppose the sense resistance shown in FIGS. 3A-3C are implemented in a process with 4 metal layers, the terminals can be at a fourth metal layer while the sense and gain resistances (Rsns, Rg) are realized in lower level metal. To conserve silicon area, the terminals of the fourth metal layer can overlap or be placed on top of the sense resistance body. While overlapping the terminals with the sense resistance or placing terminals on top reduces the overall area usage, doing so might introduce additional stress to the sense resistance body that might or might not have a nonnegligible effect to the matching between the sense and replica resistance.

In some examples, an integrated circuit including the sense and gain resistances can be packaged with an amplifier to provide a current sensing circuit such as the circuit of FIGS. 1A, 1B, 2, etc. In some examples, an integrated circuit including the sense and gain resistances can be packaged with an amplifier and an analog-to-digital converter (ADC)

to provide a current sensing circuit capable of providing a digital representation of the load current.

For current sense circuits that include multiple replica or gain resistances (Rg), the gain resistances (Rg) can be implement in between the metal layers of the sense resistance (Rsns). In certain examples, the gain resistances (Rg) can be interdigitated such that their resistance values match with each other. It should be noted that this design approach is not limited to using only 3 metal layers. In certain examples, the three metal layers discussed above can each be comprised of multiple layer of metals connected in parallel or in series. Alternately and as discussed below, the sense and gain resistances (Rsns, Rg) can be interleaved such that the gain resistance(s) sample the temperature of the sense resistance(s) metal on multiple layers.

Figure 4A:
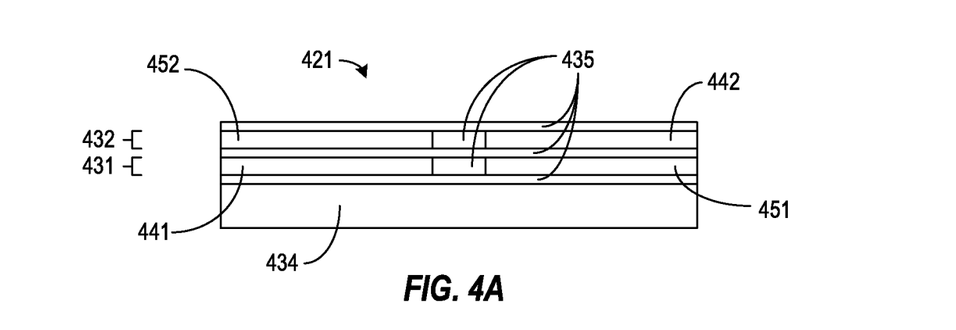
FIGS. 4A-4C illustrate an example module including sense and gain resistances.
Figure 4B:
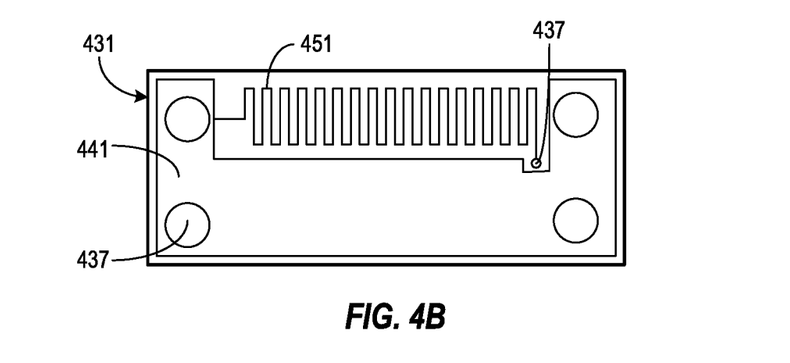
Figure 4C:
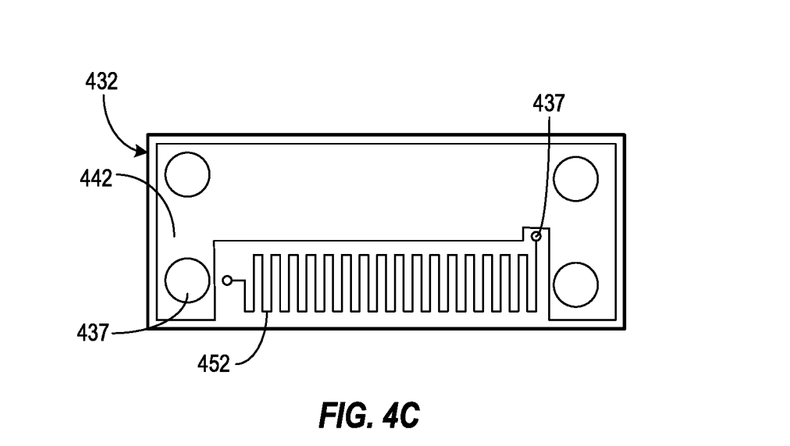

The present inventors have recognized additional techniques to further improve current sensing accuracy. FIGS. 4A-4C illustrate an example module 421 including sense and gain resistances (Rsns, Rg). FIG. 4A is a simplified side-view of the module 421 that include two metal layers 431, 432 used to form one or more portions of a sense resistance (Rsns) and one or more portions of a gain resistance (Rg). FIG. 4B illustrates a top view of the first metal layer 431 of the module and captures detail of the layout of the first metal layer 431. FIG. 4C illustrates a top view of the second metal layer 432 of the module 421 and captures detail of the layout of the second metal layer 432. Referring to FIG. 4A, the example module 421 can include two metal layers 431, 432, a substrate 434 and insulative material 435. The module 421 can also include vias 437 and terminals but those are not shown in the simplified view of FIG. 4A. In certain examples, each metal layer 431, 432 can include a portion 441, 442 of the sense resistance (Rsns) and a portion 451, 452 of the gain resistance (Rg). As with the example of FIGS. 3A-3C, the thin nature of the electrical insulative layer between the metal layers 431, 432 can allow the gain resistance portions to experience and track temperature fluctuations along with the sense resistance portions. In addition, other characteristics that might vary, such as sheet resistivity ($\rho$), or sheet rho, of each metal layer 421, 422, can be averaged by having portions 441, 442, 451, 452 of each of the gain resistance (Rg) and the sense resistance (Rsns) occupy each metal layer 431, 432 of the module 421.

Referring to FIGS. 4B and 4C, the module 421 can include a sense resistance (Rsns) implemented via two sense resistance bodies 441, 442 and a gain resistance (Rg) implemented via two gain resistance bodies 451, 452. A first sense resistance body 441 and a first gain resistance body 451 can be implemented in a first metal layer 431 and a second sense resistance body 442 and a second gain resistance body 452 can be implemented in a second metal layer 432. When assembled in the module 421, the first metal layer 431 can underly the second metal layer 432 and can be electrically isolated from the substrate 434 and the second metal layer by the insulative material 435. In some examples, the substrate 434 and the insulative layers 435 can be printed circuit board material. In some examples, the substrate 434 can be a semiconductor substrate such as silicon, and the insulative layers 435 can be an oxide material such as silicon oxide. In certain examples, the sense resistance bodies can be thin sheets of metal and the gain resistance bodies can be serpentine patterns of the same metal. In certain examples, the module 421 can include vias 437 to electrically connect the resistance bodies for the intended current sense circuit (e.g., FIG. 1A, FIG. 1B, or FIG. 2), and to connect the resistance bodies to external terminals for packaging and interconnection with other components of a current sense circuit.

Figure 5:
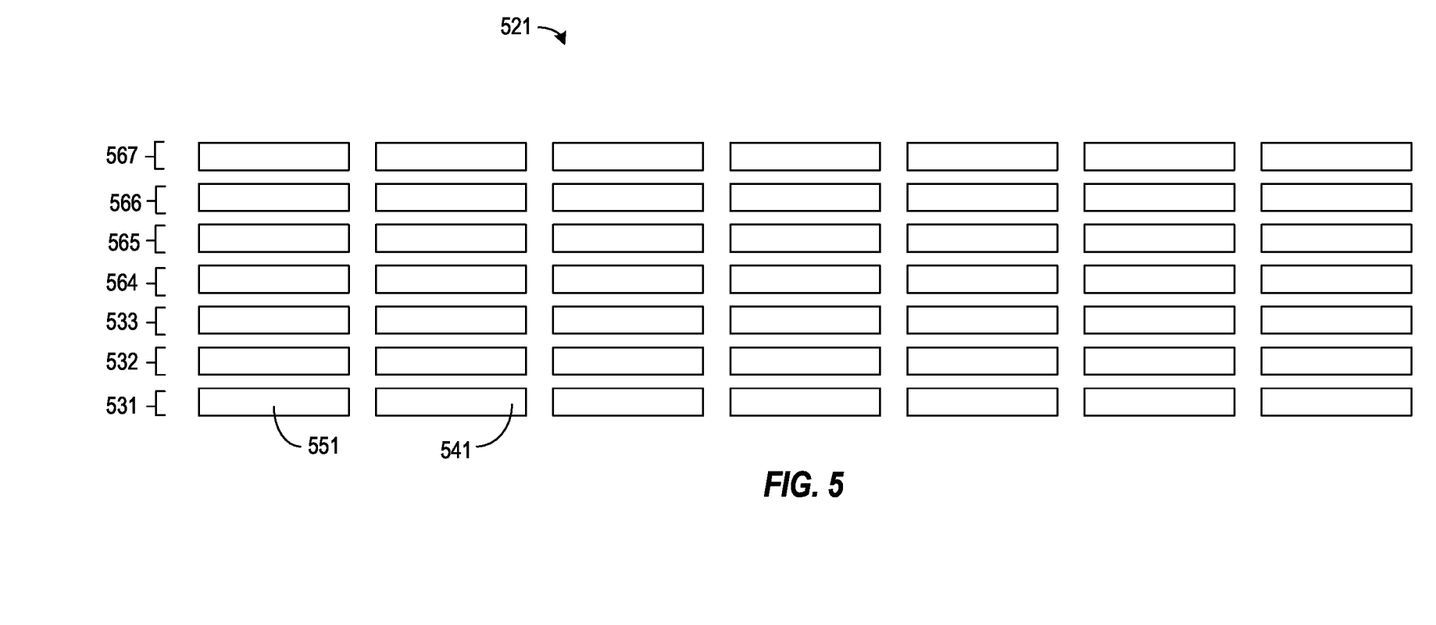
FIG. 5 illustrates generally a simplified side-view of an example module employing more than three metal layers.

FIG. 5 illustrates generally a simplified side-view of an example module 521 employing more than 3 metal layers. The simplified view is intended to show a cutaway arrangement of components of an example current sense module 521 and is not intended to show details of, for example, vias, terminations, substrate, or insulative materials that are also included in various examples of the module 521. The example module 521 includes seven metal layers 531, 532, 533, 564, 565, 566, 567 with each layer including a portion 541 of one or more sense resistances (Rsns) and a portion 551 of one or more gain resistances (Rg). The illustrated example shows each metal layer having a single area dedicated to a portion 551 of the one or more gain resistances (Rg), however, the subject matter is not so limited. As discussed above, having each metal layer include a portion of both the sense resistance (Rsns) and the gain resistance (Rg), characteristics such as temperature can be more closely tracked by each resistance to the other, and sheet anomalies such as sheet rho can be averaged for the combined resistances of the one or more sense resistance portions 541 and the one or more gain resistance portions 551.

Figure 6:
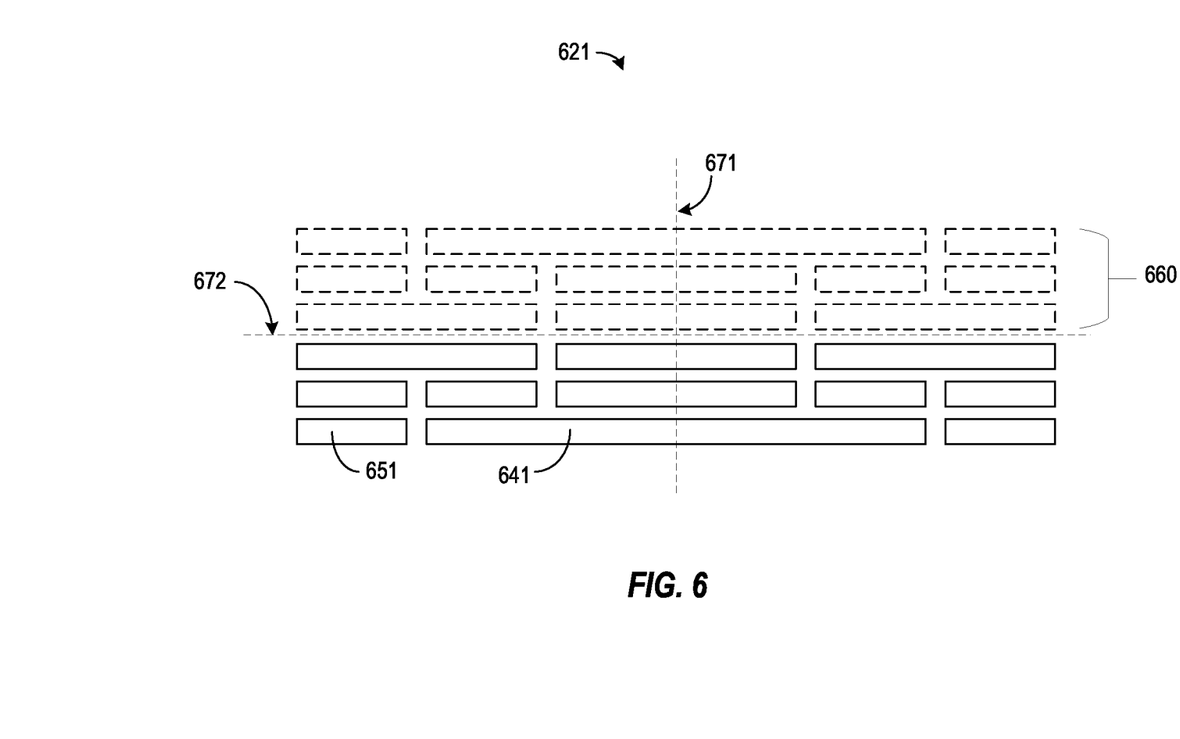
FIG. 6 illustrates generally a simplified side-view of an example module implementing a mirrored layout of sense resistance portions and gain resistance portions via multiple metal layers.

FIG. 6 illustrates generally a simplified side-view of an example module 621 implementing a mirrored layout of the sense resistance (Rsns) portions and the gain resistance (Rg) portions via multiple metal layers. The simplified view is intended to show a cutaway arrangement of components of an example current sense module 621 and is not intended to show details of, for example, vias, terminations, substrate, or insulative materials that are also included in various examples of the module 621. The lateral mirrored layout about a vertical axis 671 can accomplish close temperature tracking of the gain resistance (Rg) to the sense resistance (Rsns) via the overlaying and sandwiched nature of the portions 651 of the gain resistance bodies relative to the portions 641 sense resistance bodies. The lateral mirrored layout of the module can also average characteristics of the module 621, such as sheet rho of the metal layers, that can vary from metal layer to metal layer. In addition, the lateral mirrored layout can further average temperature and other characteristics, such as sheet rho, that can vary across a lateral dimension of the module 621. For example, if the module is packaged next to a device that can significantly source or sink thermal energy, the temperature across a lateral dimension of the module 621 can vary. The lateral, mirror image of the respective portions 641, 651 of both the gain resistance bodies and the sense resistance bodies can average out the thermal effects of the neighboring device as each portion of the respective resistance that is operating in a high thermal area has a corresponding portion operating in a corresponding mirrored and low thermal area. FIG. 6 illustrates optionally additional metal layers 660 that provide elevation or vertical mirroring of the portions of the sense resistance 641 and the portions of the gain resistance 651 in a vertical direction of the layout about a second axis 672.

In a simulation, test modules using three independent metal layers to implement the sense and gain resistances as disclosed above were fabricated and packaged with an amplifier and an ADC. The sheet rho of the metals had a variation ($\sigma$) of 4%. Of the batch of modules fabricated, 99.7% of the modules provided current readings within 0.7% without trimming of the gain resistances. 93.4% of modules provided current readings within 0.3% without trimming the gain resistances. In addition to the above accuracy results, the methods for fabrication the modules can utilize existing and well understood semiconductor and printed circuit board manufacturing techniques.

Figure 7:
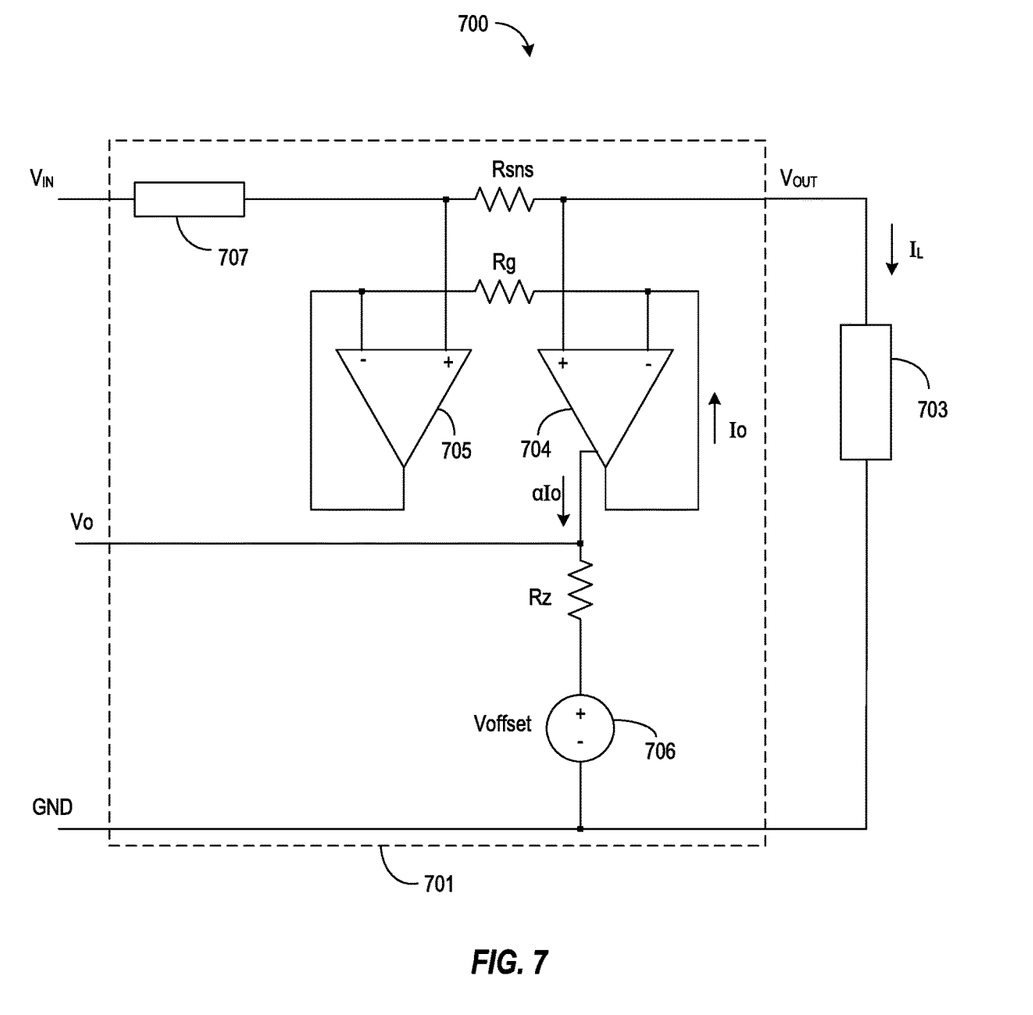
FIG. 7 illustrates generally an example current sense circuit according to the present subject matter.

FIG. 7. illustrates generally a system 700 including an example current sense circuit 701 according to the present subject matter. The system 700 can include the current sense circuit 701 and a load 703 configured to receive power via the current sense circuit 701 at an output voltage ($V_{OUT}$). In certain examples, the current sense circuit 701 can be a single integrated circuit. In certain examples, the current sense circuit 701 can pass power received from a supply to the load 703. The current sense circuit 701 can include a current sense resistance (Rsns), a gain resistance (Rg), and sense circuitry to provide an indication (Vo) of the current ($I_L$) passed to the load, sometimes referred to as load current. In certain examples, as load current ($I_L$) passes through the sense resistance (Rsns) a voltage drop develops across the sense resistance (Rsns) that is proportional to the load current ($I_L$). The sense circuitry can provide a corresponding voltage drop across the gain resistance (Rg) and can generate a scaled version (Io, αIo) of the load current ($I_L$). Either the scaled version (αIo) of the load current ($I_L$), or a voltage (Vo) derived from the scaled version (αIo) of the load current ($I_L$), can be provided at an output of the current sense circuit 701 and used to indicate the actual load current ($I_L$). In certain examples, the sense circuitry can include two amplifiers 704, 705 and optional output circuitry including an offset voltage source 706 and an output resistance (Rz). The gain transistor (Rg) is not directly coupled to the sense resistance (Rsns). However, each node of the gain resistance (Rg) can be coupled to a corresponding node of the sense resistance (Rsns) via the virtual short between the inputs of each amplifier 704, 705 when the amplifiers are coupled in a negative feedback configuration as illustrated. The virtual short of each amplifier 704, 705 allows the gain resistance (Rg) to experience the same voltage drop as the sense resistance (Rsns) experiences. In turn, the current (Io) supported by the outputs of the amplifiers 704, 705 to produce the voltage drop across the gain resistance (Rg) is proportional to the load current ($I_L$). In certain examples, one of the amplifiers 704 can include a second output to provide an amplified version (αIo) of the current (Io) supported by the amplifiers 704, 705 to produce the voltage drop across the gain resistance (Rg). The amplified version (αIo) of the current (Io) supported by the amplifiers 704, 705 to produce the voltage drop across the gain resistance (Rg) can be used to provide a representation of the load current ($I_L$), either directly, or by passing the current (αIo) through the output resistance (Rz) as shown.

In certain examples, the current sense circuit 701 can indicate load current ($I_L$) being sunk by the load 703 or being sourced by the load 703. However, the representation (Vo) of the load current as shown, is not bi-polar. In certain examples, the current sense circuit 701 can include an offset voltage source 706 such that bi-direction load current ($I_L$) can be represented using a unipolar voltage output. In such applications, no load current ($I_L$=0) can typically be represented by a positive voltage commensurate with the voltage provided by the offset voltage source 706. Current sunk by the load 703 can be represented at the output of the current sense circuit 701 by a voltage (Vo) higher than the offset voltage and current source by the load 703 can be represented by a voltage (Vo) lower than the offset voltage. In certain examples, the load 703 may operate at a voltage different from the voltage ($V_{IN}$) supplied to the current sense circuit 701. In such examples, the current sense circuit 701 can include a voltage regulator 707. Unlike the examples of FIGS. 1A, 1B, and 2, the integrated current sense circuit 701 may have sense resistance (Rsns) with only one external terminal.

Figure 8:
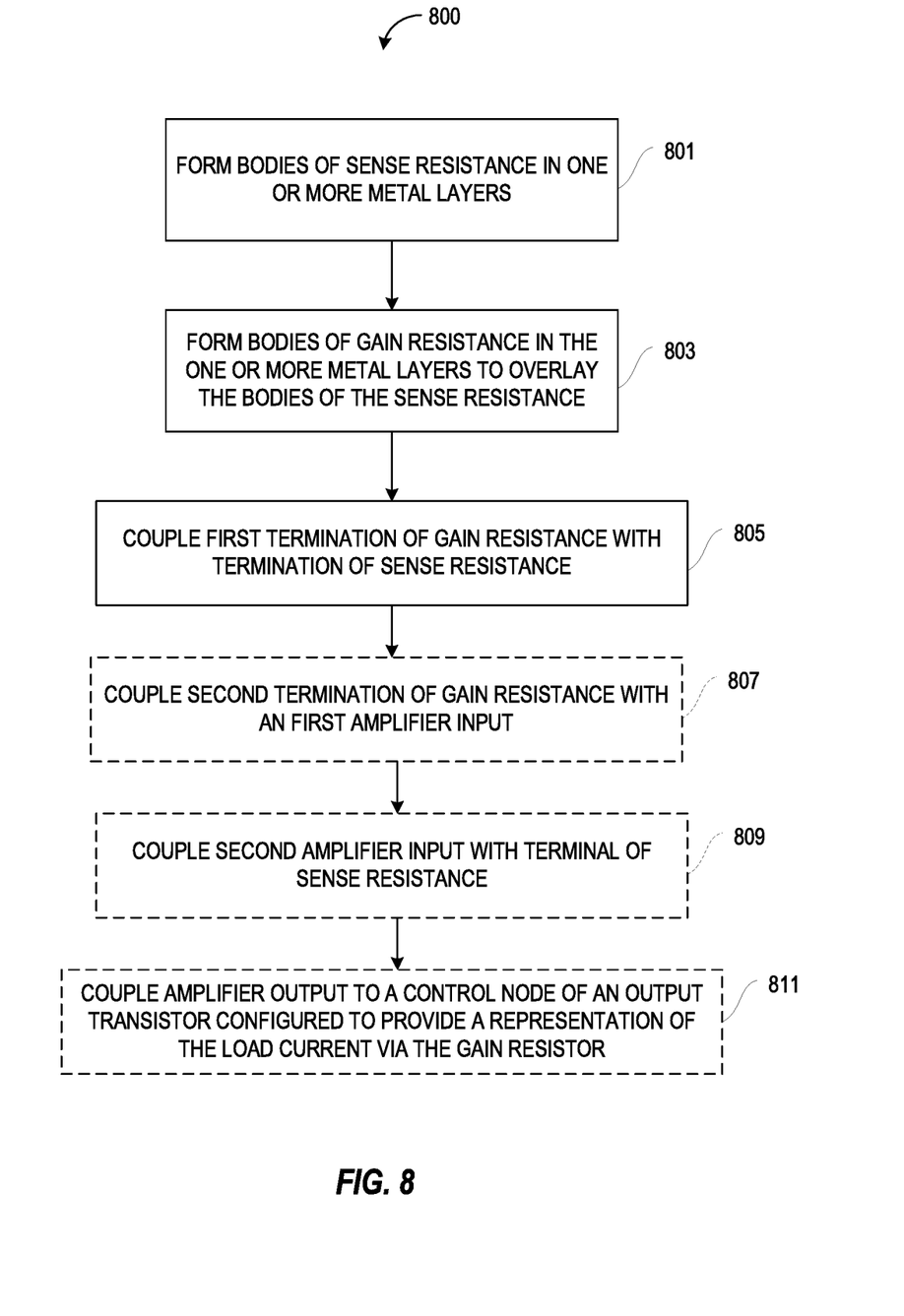
FIG. 8 illustrates generally an example method of fabricating a current sense module according to the present subject matter.

FIG. 8 illustrates generally an example method 800 of fabricating a current sense module according to the present subject matter. At 801, a portion of a body of a sense resistance can be formed in a first one or more metal layers disposed on a substrate. In certain examples, the sense resistance can include the body portion and one or more pads for termination with a supply or load so as to conduct a load current. At 803, a portion of a body of a gain resistance can be formed using a second one or more metal layers overlying at least one metal layer of the first one or more metal layers. At 805, a first termination of the gain resistance can be coupled to a first termination of the sense resistance. In certain examples, the module does not include any other circuit components for a current sensor other than one or more sense resistances and one or more gain resistances. In certain examples, the method 800, at 807, can optionally include coupling a second termination of the gain resistance to a first input of an amplifier. In certain examples, the amplifier can be integrated on the substrate. In some examples, the amplifier can be implemented in a second module package and can be coupled with the module including the sense and gain resistances. At 809, a second input of the amplifier can be coupled with to a second termination of the sense resistance. At 811, an output of the amplifier can be coupled to a control node of an output transistor configured to provide a representation of the load current via the gain resistance. In certain examples, the output transistor can be integrated with the amplifier circuit ad co-packaged with the module including the sense and gain resistances. In some examples, the method can optionally include coupling an output node of the output transistor with an input of a co-packaged analog-to-digital converter to provide a digital representation of the load current. In certain examples, the amplifier, output transistor and ADC can be co-located within an integrated circuit and packaged with the module including the sense and gain resistances to form a current sensor.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. An apparatus for sensing current, the apparatus comprising:
    a substrate;
    a plurality of metal layers stacked on the substrate and separated from the substrate and from each other by an insulation material;
    wherein a first one or more metal layers comprise a sense resistance configured to pass current between a source and a load; and
    wherein a second one or more metal layers comprise one or more gain resistances coupled to the sense resistance and configured to couple to a current sense amplifier.

2. The apparatus of claim 1, wherein each metal layer includes a portion of the sense resistance and a portion of the one or more gain resistances.

3. The apparatus of claim 1, wherein the one or more gain resistances have a serpentine layout on a respective metal layer of the second one or more metal layers.

4. The apparatus of claim 1, including the current sense amplifier.

5. The apparatus of claim 1, wherein the one or more gain resistances are coupled to the sense resistance via a virtual short of the sense amplifier.

6. The apparatus of claim 1, wherein the substrate is a semiconductor.

7. The apparatus of claim 1, wherein the substrate is a resin based substrate.

8. The apparatus of claim 1, including a multiple metal layer layout of the one or more gain resistances, the multiple metal layer layout including:
    the first one or more metal layers;
    the second one or more metal layers;
    a first layout portion; and
    a second layout portion;
    wherein the first layout portion and the second layout portion form a mirror image layout of each other; and
    wherein the mirror image layout is configured to allow environmental conditions of the one or more gain resistances to track with environmental conditions of the sense resistance.

9. The apparatus of claim 1, wherein each layer of the first one or more metal layers includes a plurality of metal layers; and
    wherein each layer of the second one or more metal layers includes the plurality of metal layers.

10. The apparatus of claim 1, wherein each layer of the plurality of metal layers includes a portion of a body of the sense resistance; and
    wherein each layer of the plurality of metal layers includes a portion of a body of each of the one or more gain resistances; and
    wherein the plurality of metal layers forming the bodies of the sense resistance and the one or more gain resistances is configured to provide the sense resistance with a resistivity commensurate with the resistivity of the one or more gain resistances.

11. A circuit package comprising:
    an amplifier configured to provide a representation of a load current;
    means for sensing the load current;
    means for applying a gain to the amplifier; and
    means for averaging a resistivity of the means for sensing and for averaging a resistivity of the means for applying the gain.

12. The circuit package of claim 11, including means for tracking an environmental condition of the means for sensing.

13. The circuit package of claim 12, wherein the means for tracking an environmental condition of the means for sensing include overlaid metal layers that comprise the means for sensing the load current and the means for applying a gain to the amplifier.

14. The circuit package of claim 13, wherein a cross-section of the overlaid metal layers is symmetrical about a line perpendicular to the metal layers.

15. The circuit package of claim 14, wherein the cross-section of the overlaid metal layers is symmetrical about a line parallel to the metal layers.

16. The circuit package of claim 11 including an analog to digital comparator configured to receive the representation of the load current and to provide a digital representation of the load current.

17. The circuit package of claim 11, wherein an integrated circuit distinct from the amplifier includes the means for sensing the load current and the means for applying a gain to the amplifier.

18. A method of fabricating a current sensor comprising:
   forming at least a portion of a body of a sense resistance using a first one or more metal layers disposed on a substrate, the sense resistance including a first termination and a second termination, the sense resistance configured to conduct a load current via the first termination and the second termination;
   forming at least a portion of a body of a gain resistance using a second one or more metal layers overlying at least one metal layer of the first one or more metal layers;
   coupling a first termination of the gain resistance to the first termination of the sense resistance;
   coupling a second termination of the gain resistance to a first input of an amplifier;
   coupling a second input of the amplifier to the second termination of the sense resistance; and
   providing a representation of the load current using an output of the amplifier.

19. The method of claim 18, wherein the forming the at least a portion of the body of the gain resistance includes forming a first portion of the gain resistance within the first one or more metal layers forming the at least a portion of the body of the sense resistance.

20. The method of claim 19, wherein a cut-away layout of a combination of the sense resistance and the gain resistance is symmetrical about a line perpendicular to each of the first one or more metal layers and each of the second one or more metal layers.

* * * * *